United States Patent
Culler

(10) Patent No.: US 6,995,583 B2
(45) Date of Patent: Feb. 7, 2006

(54) STRUCTURE AND METHOD FOR DYNAMIC CONTROL OF OUTPUT DRIVER VOLTAGE

(75) Inventor: Jason Harold Culler, Livermore, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 90 days.

(21) Appl. No.: 10/448,762

(22) Filed: May 30, 2003

(65) Prior Publication Data

US 2004/0239390 A1 Dec. 2, 2004

(51) Int. Cl.
*H03K 19/003* (2006.01)

(52) U.S. Cl. .................. 326/27; 326/113; 327/170; 327/396

(58) Field of Classification Search .............. 326/26, 326/27, 82, 83, 113; 327/170, 396
See application file for complete search history.

(56) References Cited

U.S. PATENT DOCUMENTS

| 6,388,486 B1 * | 5/2002 | Schultz .................. 327/170 |
| 6,483,757 B2 * | 11/2002 | Manning .................. 365/194 |
| 6,721,910 B2 * | 4/2004 | Ninomiya et al. .......... 714/718 |

* cited by examiner

*Primary Examiner*—Daniel D. Chang

(57) ABSTRACT

A method and structure for control of a rise time of a bus signal coupled to a driver circuit. A bus is coupled to the driver circuit and is operable to carry the bus signal. Voltage control elements are coupled to the driver circuit and the bus, and are operable to increase or decrease a voltage of the bus signal relative to a ground at one or more time instants. A control circuit coupled to the voltage control elements is operable to control the switching of the voltage control elements, thereby controlling the voltage level of the bus signal. Controlling a rise time of the bus signal of the driver circuit includes adaptively adjusting a voltage level of the bus signal relative to a ground at one or more discrete times by the use of the voltage control elements.

40 Claims, 13 Drawing Sheets

1200

1300

US 6,995,583 B2

STRUCTURE AND METHOD FOR DYNAMIC CONTROL OF OUTPUT DRIVER VOLTAGE

TECHNICAL FIELD

This invention relates generally to the field of integrated circuit devices, and more specifically to the control of a voltage of an output driver of an integrated circuit.

BACKGROUND

An integrated circuit often contains output drivers coupled to a bus, where the output drivers provide an output voltage signal carried by the bus that meets specified amplitude and rise time requirements. Output pads, coupled to an integrated circuit and used as a connection point to output signals of the integrated circuit, have very basic pre-driver and drivers that turn on or control a single or multiple leg design in order to control the rise time of an output voltage signal. The bus coupled to the output driver may be a terminated or unterminated bus. More complex output pads may turn on FET legs with a delay loop or control circuitry, which can be viewed as switching resistors into the bus.

This approach is less effective on un-terminated buses. If the output driver is not controlled, the resulting voltage spike may impact the bus coupled to the output driver. The voltage spike can create ringing and signal integrity issues on a signal carried by the bus. More complex pads don't drive the bus signal to specific voltage levels—but instead control switching of FET legs of the driver.

SUMMARY

A method and structure for control of a rise time of a bus signal coupled to a driver circuit is disclosed. The structure includes a bus coupled to the driver circuit wherein the bus is operable to carry the bus signal. One or more voltage control elements are coupled to the driver circuit and coupled to the bus. The voltage control elements increase or decrease a voltage of the bus signal relative to ground at several time instants so that the rise time of the bus signal may be controlled in a precise manner. The time instants may be irregular or evenly spaced. A control circuit controls the switching of the voltage control elements, thereby controlling the voltage level of the bus signal. The method for controlling the rise time of the bus signal of the driver circuit comprises adaptively adjusting the voltage level of the bus signal relative to ground at one or more discrete times by the use of one or more voltage control elements.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
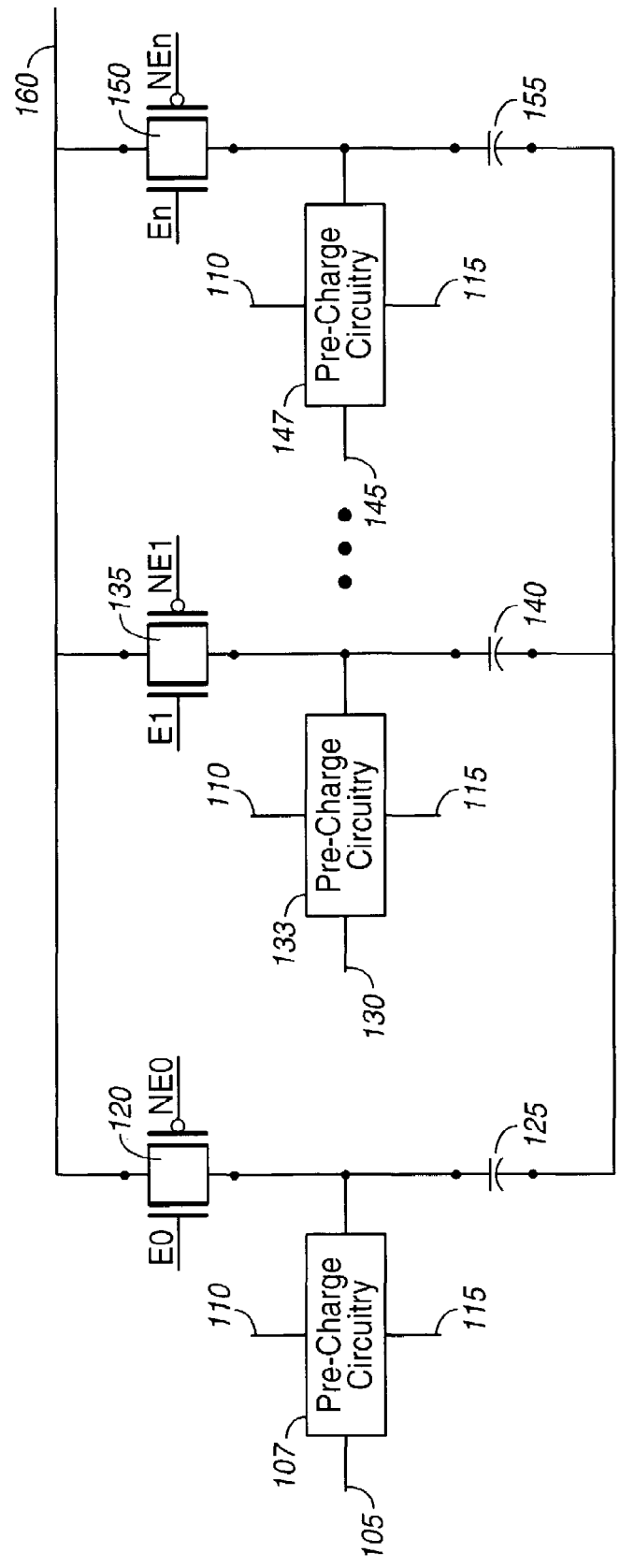
FIG. 1 is a schematic of a voltage control circuit, in accordance with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

In an unterminated bus, there is very little or no leakage of charge on a signal line an output driver is coupled to. The load applied by the output driver may be modeled as an appropriately sized capacitive element. So when trying to control a rise time of a signal on the signal line coupled to the output driver, there is a need to control an amount of charge placed on the line. Conversely, in a terminated system, the receiving circuit continuously terminates the signal (to VDD or VDD/2 for example). Therefore, to control a rise time of a signal being driven by the output driver, there is a need to continuously fight the termination to pull the signal up or down. This is also known as drive-fight.

In an example of an unterminated bus case in a certain embodiment of the present invention, the output driver may be configured by switching in a plurality of pre-charged capacitive elements, wherein each capacitive element of the plurality of capacitive elements is a fraction of a capacitance of a signal line coupled to the output driver and a load as measured at a point of coupling between the output driver and the signal line. Each capacitive element of the plurality of capacitive elements that is switched in raises or lowers the voltage a set amount. Depending on the size of the capacitive elements in relation to the signal line and load capacitance—a total number of capacitive elements switched in adds up to much more capacitance of the line and load to obtain a significant voltage change on the bus.

In an example of the terminated case in accordance with a certain embodiment of the present invention, a voltage or current source may be used to counteract with the termination at the other end of the line to incrementally raise or lower the voltage on the line.

Referring now to FIG. 1 a schematic of a voltage control circuit 100 is shown, in accordance with certain embodiments of the present invention. Pre-charge circuitry 107, 133, and 147 are coupled to corresponding transistive element 120 and capacitive element 125, transistive element 135 and capacitive element 140, and transistive element 150 and capacitive element 155. It is noted that although three pre-charge elements are shown, voltage control circuit 100 may contain more than three pre-charge elements without departing from the spirit and scope of the present invention. Pre-charge circuitry 107, 133, and 147 receive corresponding data 105, 130, and 145. Pre-charge circuitry 107, 133, 147 operate on data 105, 130, 145 to produce a signal that couples pre-charge circuitry 107 to transistive element 120 and capacitive element 125, couples pre-charge circuitry 133 to transistive element 135 and capacitive element 140, and couples pre-charge circuitry 147 to transistive element 150 and capacitive element 155. Pre-charge circuitry 107, 133, 147 are all coupled to a corresponding ground 115 and supply voltage 110, while capacitive elements 125, 140, and 155 are coupled to ground 115. Transistive element 120 is coupled to corresponding inputs E0, NE0, while transistive element 135 is coupled to corresponding inputs E1, NE1, and transistive element 150 is coupled to corresponding inputs EN, NEN.

Output signal 160 is determined by the outputs of transistive elements 120, 135, and 150. The outputs of transistive elements 120, 135, and 150 are determined by E0, E1, NE0, and NE1 in accordance with the corresponding outputs of pre-charge circuitry 107, 133, and 147. In a certain embodiment of the present invention, capacitive elements 125, 140, and 155 are capacitors, while transistive elements 120, 135, and 150 are FETs. The following figures illustrate how the use of transistive elements 120, 135, and 150 can be switched on and off in order to control a value of output signal 160 at one or more time instants. This control allows a precise rise time of output signal 160 to be established.

It is noted that one of skill in the art will recognize that other circuit structures could be used to enable precise rise time control of output signal 160. As an example, a voltage divider or one or more FET legs could be used to provide the voltage increments when a bus carrying output signal 160 is terminated. When the bus carrying output signal 160 is unterminated, the voltage divider or a switched capacitive circuit could be used to provide the voltage increments.

Figure 12:
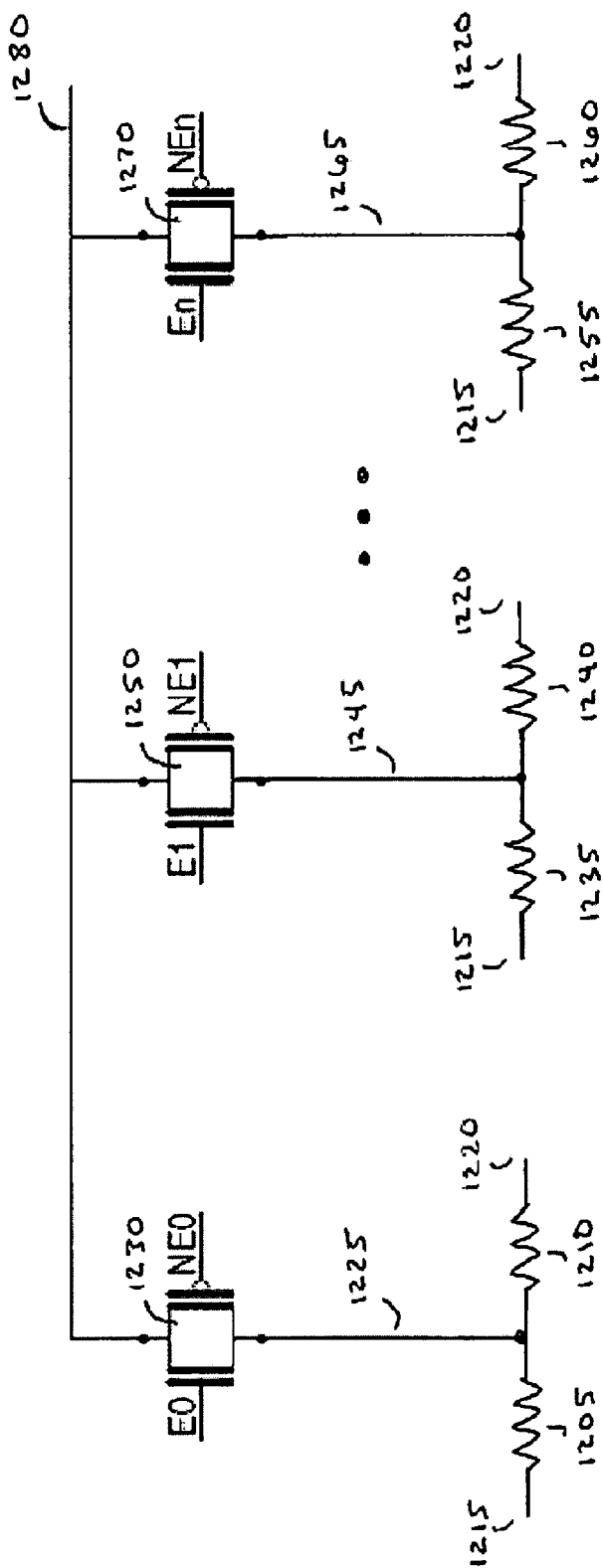
FIG. 12 is a schematic of a voltage control circuit, in accordance with certain embodiments of the present invention.
Figure 13:
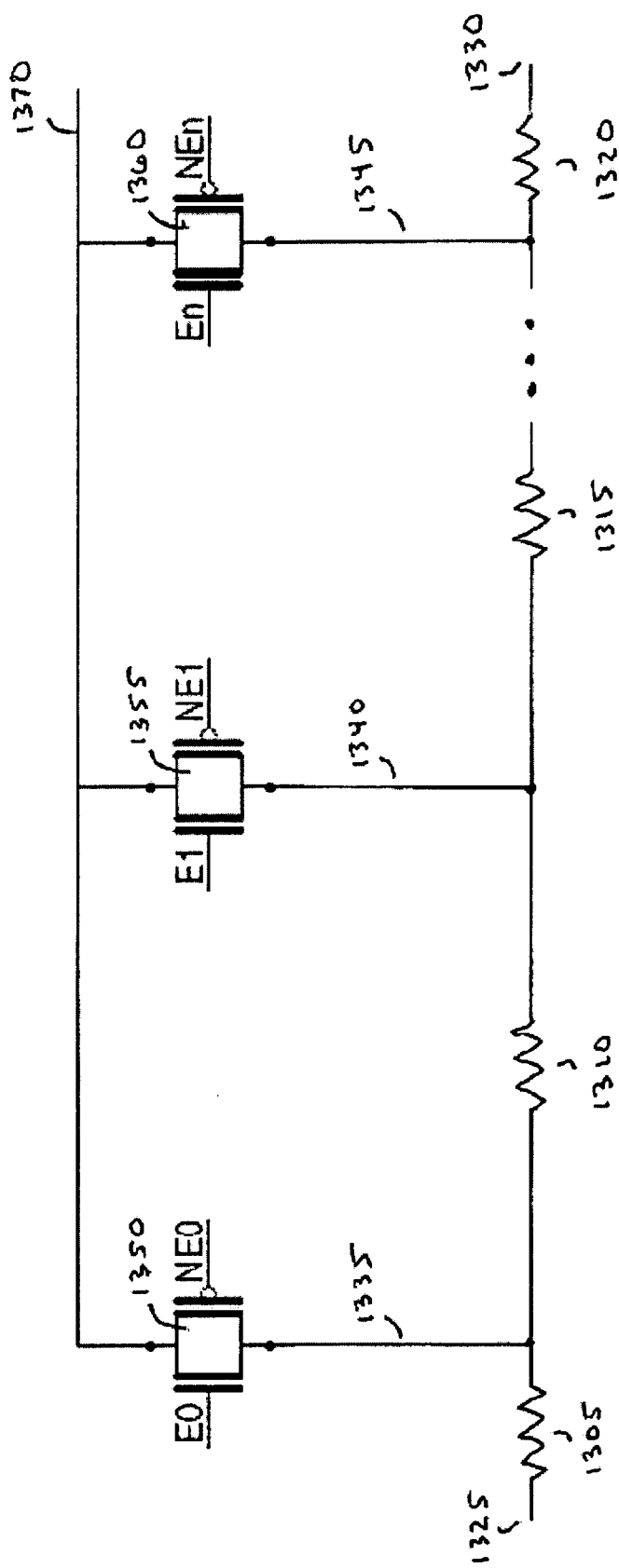
FIG. 13 is a schematic of a voltage control circuit, in accordance with certain embodiments of the present invention.

Referring now to FIGS. 12 and 13, schematics of voltage control circuits that present alternate embodiments using voltage dividers are shown. In FIG. 12, resistors 1205, 1210, 1235, 1240, 1255 and 1260 comprise three voltage dividers as shown. The outputs of the voltage dividers are signals 1225, 1245, and 1265 that may be switched to the output, signal 1280, by their respective pass gates 1230, 1250 and 1270, respectively. In this particular embodiment, 1215 is a high voltage potential, such as Vdd, whereas 1220 is a low voltage potential such as ground GND. In FIG. 13, the single voltage divider comprises resistors 1305, 1310, 1315 and 1320. In this embodiment, three different voltages are created, shown as 1335, 1340 and 1345, which are then passed to output signal 1370 through the three pass gates 1350, 1355, and 1360. 1325 is representative of a high voltage potential such as Vdd, while 1330 may be a low voltage supply, like ground GND, for each of the three voltage dividers. In both cases, the number of voltage dividers, or the number of output voltages, and thus voltage steps, may be any number from 1 to N, with three just being the example shown in this particular embodiment.

Referring again to FIG. 1, which illustrates a system operable to switch in capacitive elements 125, 140, and 155, in accordance with certain embodiments of the present invention capacitive elements 125, 140, and 155 are charged to GND when driving low and charged to VDD when trying to drive the output signal 160 high. Values of capacitive elements 125, 140, and 155 are designed in order to achieve an acceptable voltage change on the bus. As a first example, if the output signal 160 and a load to be driven amount to 10 pF of effective capacitance, and all the capacitive elements 125, 140, and 155 switching in are also 10 pF total capacitance, then it should be possible to change a voltage by VDD/2—or 50° of a supply voltage are using. This first example works well for unterminated buses. As a second example, if the capacitance values provided in the first example are used in a terminated bus, a termination at a far end would "bleed" off all charge of the capacitive elements 125, 140, and 155. In a certain embodiment of the present invention, voltage or current sources such as Field Effect Transistors (FETs) would be used as capacitive elements 125, 140, and 155 when the output signal 160 is on a terminated bus.

Figure 2:
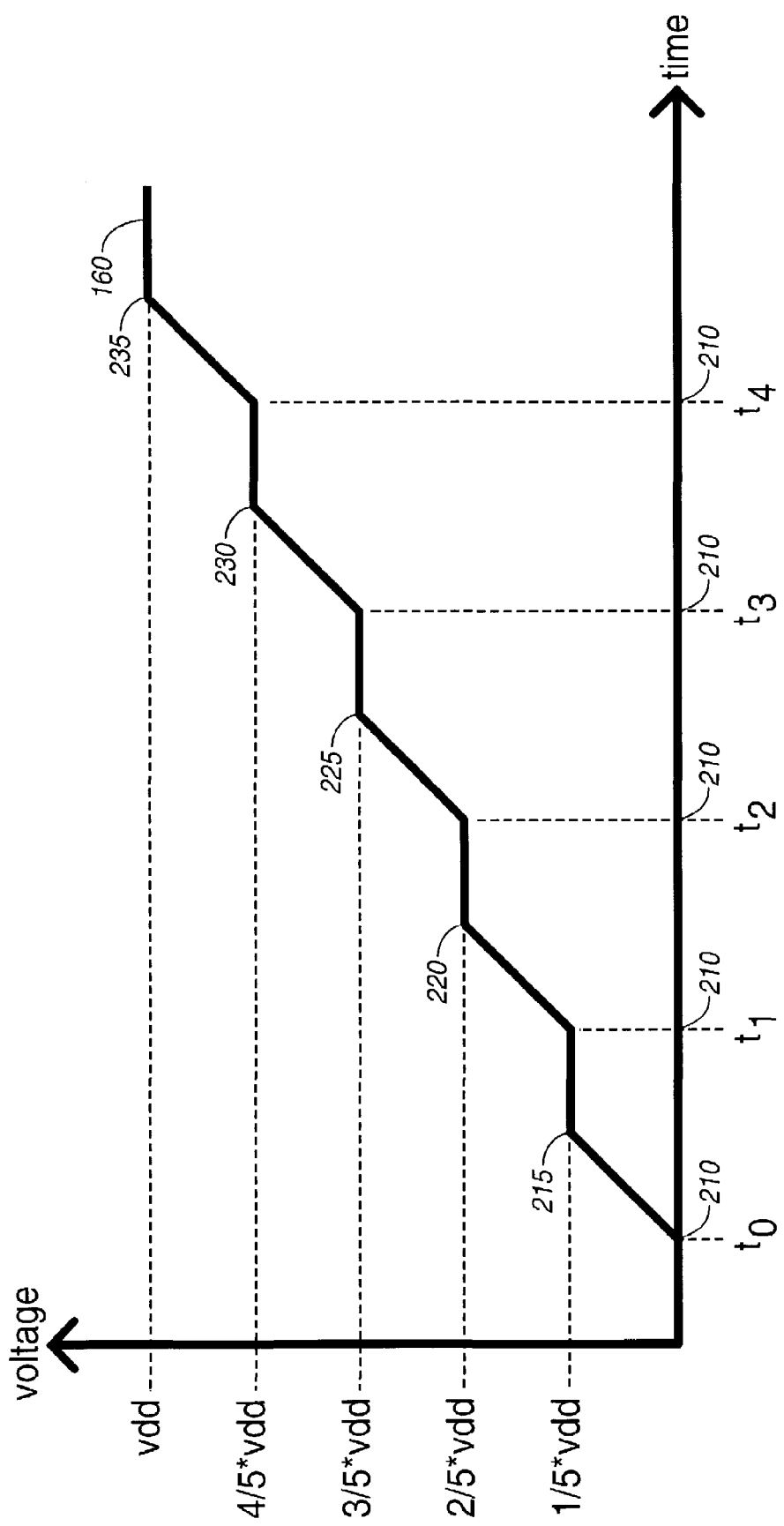
FIG. 2 illustrates a first rise time control technique, in accordance with certain embodiments of the present invention.

Referring now to FIG. 2 a first rise time control technique 200 is illustrated, in accordance with certain embodiments of the present invention. Output signal 160 is increased in fixed voltage amounts over a plurality of time instants 210. At time t0, one or more of transistive elements 120, 135, and 150 are switched so that output signal increases to a first value 215. At time t1, additional transistive elements of transistive elements 120, 135, and 150 are switched so that output signal increases to a second value 220. At time t2, second additional transistive elements of transistive elements 120, 135, and 150 are switched so that output signal increases to a third value 225. At time t3, third additional transistive elements of transistive elements 120, 135, and 150 are switched so that output signal increases to a fourth value 230. At time t4, fourth additional transistive elements of transistive elements 120, 135, and 150 are switched so that output signal increases to a fifth value 235. In a certain embodiment of the present invention, values 215, 220, 225, 230, and 235 are related by a fixed voltage increment. In the exemplary embodiment of FIG. 2, this fixed voltage increment is 0.2*(supply voltage 110). Also in a certain embodiment, the plurality of time instants 210 are equally spaced with respect to a time reference.

Figure 3:
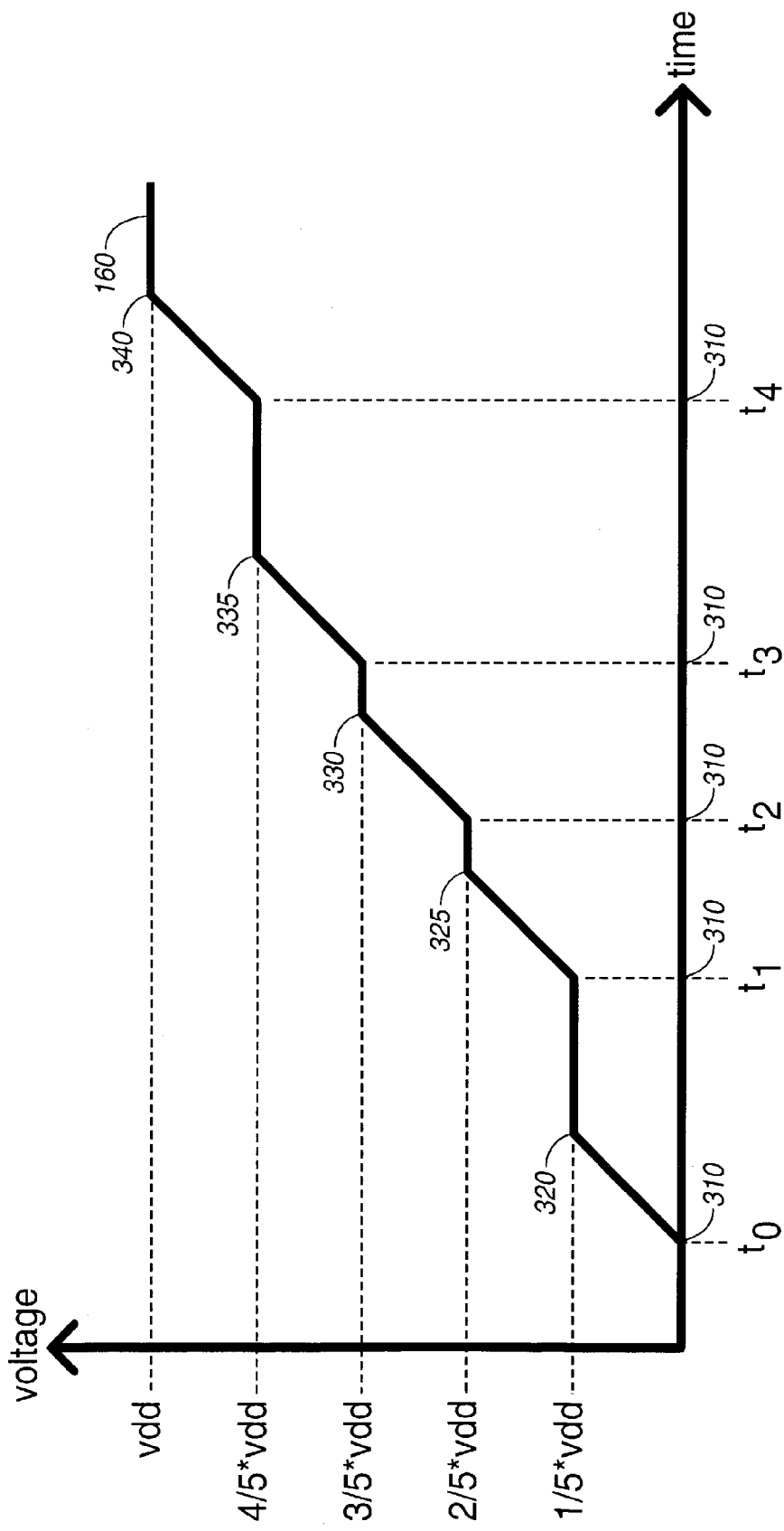
FIG. 3 illustrates a second rise time control technique, in accordance with certain embodiments of the present invention.

Referring now to FIG. 3 a second rise time control technique 300 is illustrated, in accordance with certain embodiments of the present invention. Output signal 160 is increased in variable voltage amounts over a corresponding plurality of time instants 310. At time t0, one or more of transistive elements 120, 135, and 150 are switched so that output signal increases to a first value 320. At time t1, additional transistive elements of transistive elements 120, 135, and 150 are switched so that output signal increases to a second value 325. At time t2, second additional transistive elements of transistive elements 120, 135, and 150 are switched so that output signal increases to a third value 330. At time t3, third additional transistive elements of transistive elements 120, 135, and 150 are switched so that output signal increases to a fourth value 335. At time t4, fourth additional transistive elements of transistive elements 120, 135, and 150 are switched so that output signal increases to a fifth value 340. In a certain embodiment of the present invention, values 320, 325, 330, 335, and 340 are related by corresponding variable increments of a voltage of the output signal 160. In a certain embodiment of the present invention, an amount of voltage increase at a start of a rise time is greater than any amounts of increase at subsequent time instants of the plurality of time instants 310 so that voltage increments are front-loaded. It is noted that one of skill in the art will recognize that other combinations of voltage increments of output signal 160 could be used without departing from the spirit and scope of the present invention. As an example of a choice of voltage increments, each voltage increment could be smaller than a preceding voltage increment.

Figure 4:
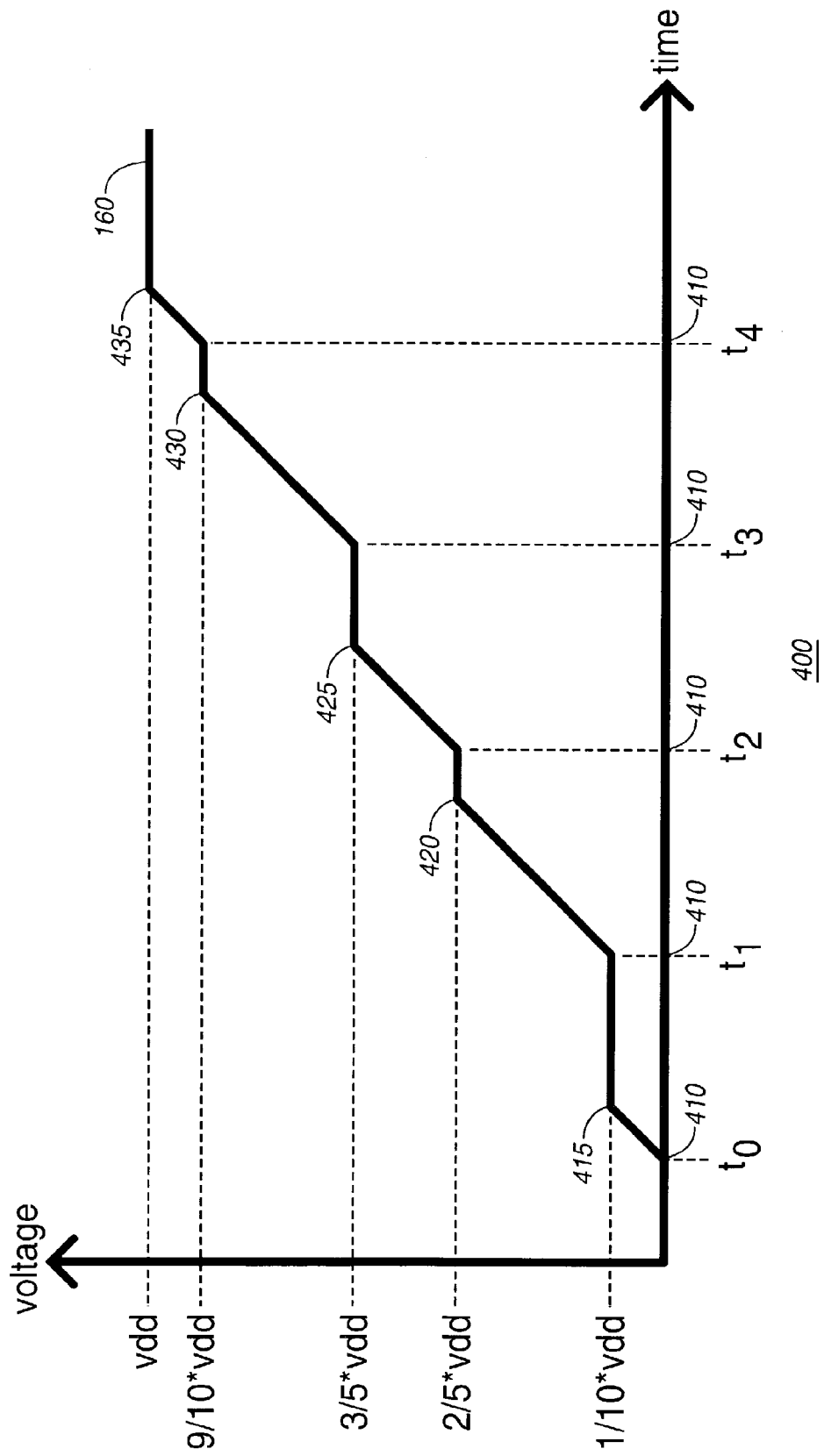
FIG. 4 illustrates a third rise time control technique, in accordance with certain embodiments of the present invention.

Referring now to FIG. 4 a third rise time control technique 400 is shown, in accordance with certain embodiments of the present invention. Output signal 160 is increased in variable voltage amounts over a corresponding plurality of time instants 410. At time t0, one or more of transistive elements 120, 135, and 150 are switched so that output signal increases to a first value 415. At time t1, additional transistive elements of transistive elements 120, 135, and 150 are switched so that output signal increases to a second value 420. At time t2, second additional transistive elements of transistive elements 120, 135, and 150 are switched so that output signal increases to a third value 425. At time t3, third additional transistive elements of transistive elements 120, 135, and 150 are switched so that output signal increases to a fourth value 430. At time t4, fourth additional transistive elements of transistive elements 120, 135, and 150 are switched so that output signal increases to a fifth value 435. The rise time control technique of FIG. 4 differs from the techniques of FIG. 2 and FIG. 3 in that a voltage increase at time t0 and time t4 are smaller than a voltage increase at time t1, t2, or t3.

Figure 5:
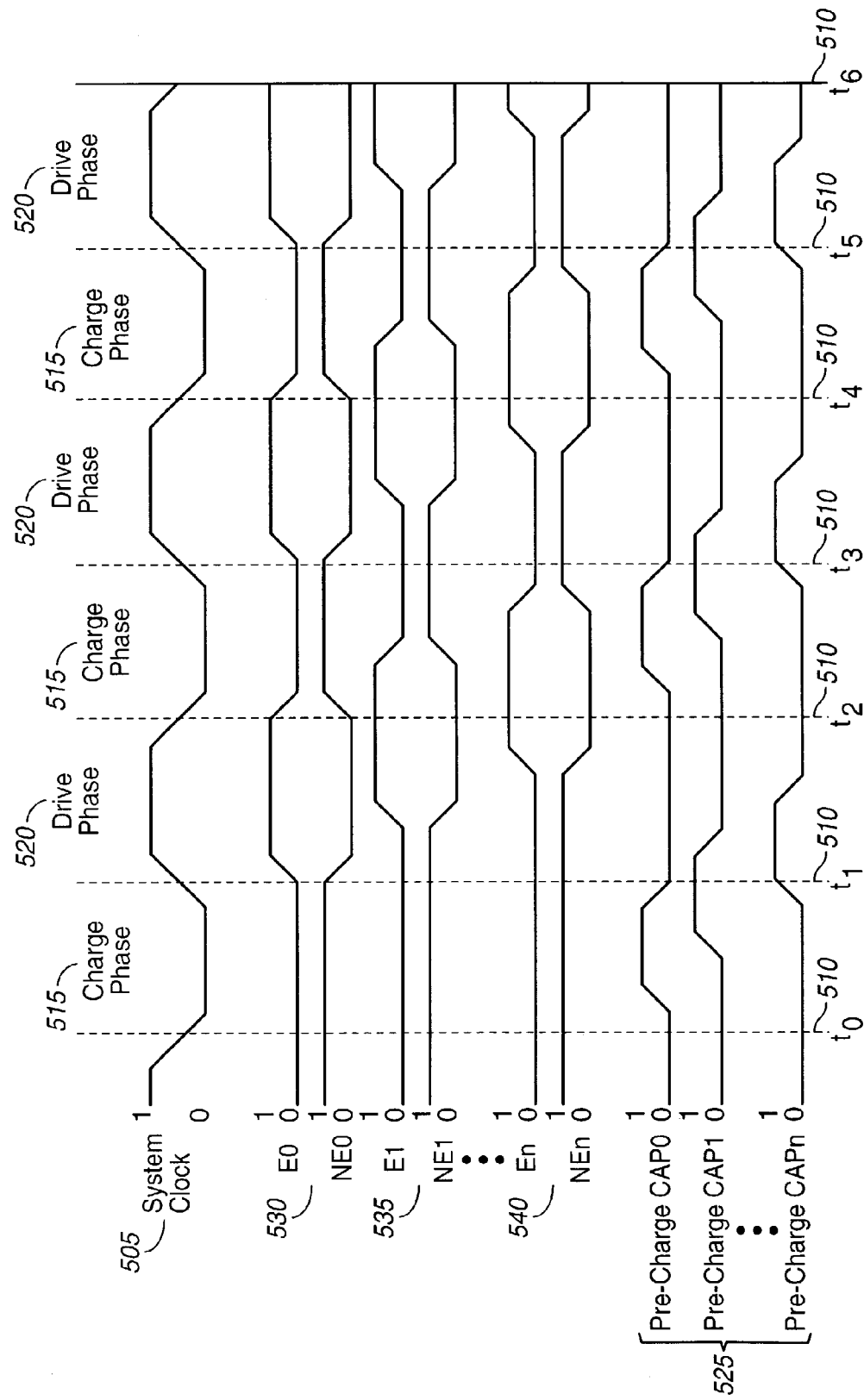
FIG. 5 is a timing diagram of the voltage control circuit, in accordance with certain embodiments of the present invention.

Referring now to FIG. 5 a timing diagram 500 of the voltage control circuit is shown, in accordance with certain embodiments of the present invention. A system clock 505 is divided into charging phases 515 and drive phases 520. During a first charge phase of charge phases 515 a plurality of capacitive elements 525 are pre-charged. Note that the plurality of capacitive elements 525 are pre-charged starting at distinct time instants. During a subsequent first drive phase of drive phases 520 outputs E0, NE0 530 of transistive element 120 transition to a high value in accordance with a first capacitive element 125 of capacitive elements 525. In a similar manner, outputs E1, NE1 535 and EN, NEN 540 of corresponding transistive elements 135, 150 transition to high value in accordance with a second capacitive element 140 and nth capacitive element 155. As indicated in FIG. 5, plurality of time instants 510 separate drive phases 520 from charge phases 515. In a certain embodiment of the present invention, there is a fixed delay between an end of pre-charging a jth capacitive element of capacitive elements 535 and a start of a rise time of signal Ej of a jth transistive element. In accordance with the rise time control techniques of FIG. 2, FIG. 3, and FIG. 4, an amount of pre-charging and an amount of delay is operable to vary for any two transitive elements and any two corresponding capacitive elements so that the plurality of voltage increments produce output signal 160 with a specified rise time.

Figure 6:
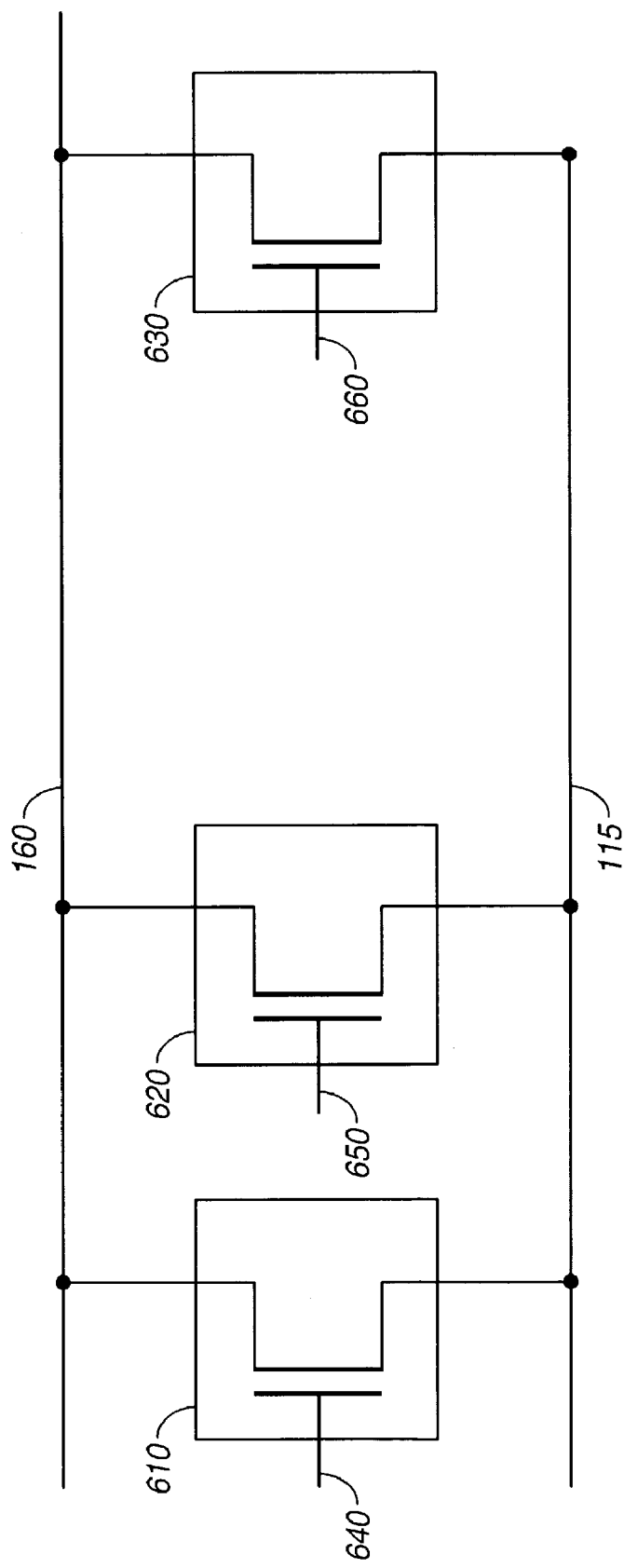
FIG. 6 is a circuit diagram of a voltage control circuit comprising pull-up and pull-down transistive elements, in accordance with certain embodiments of the present invention.

Referring now to FIG. 6, a circuit diagram 600 of a voltage control circuit comprising a plurality of pull-up and/or pull-down transistive elements transistive elements is shown, in accordance with certain embodiments of the present invention. The plurality of transistive elements are represented as elements 610, 620, 630, although it is noted that in general there could be more than these three transistive elements. Each of the plurality of transistive elements are coupled to a reference voltage, such as ground or Vdd, 115 and also coupled to an output signal 160. The plurality of pull-transistive elements are switched into output signal 160 based upon a corresponding plurality of inputs (shown as elements 640, 650, and 660). In a certain embodiment of the present invention the plurality of transistive elements are FETs. In a certain embodiment of the present invention the transistive elements are resistive elements such as resistors or FETs. Switching the plurality of transistive elements into output signal 160 is operable to allow a precise control of a rise time of output signal 160.

Referring again to FIG. 6 the plurality of pull-up transistive elements and/or plurality of pull-down transistive elements are sized to be switched in to get an acceptable voltage change on the output signal 160 we are driving. In certain embodiments of the present invention, the voltage change on the output signal 160 is proportional to a slew rate of the output signal 160. As an example of a sizing of plurality of pull-up transistive elements and plurality of pull-down transistive elements, if a receiver chip at an end of the output signal 160 has a 50 Ohm termination to a VDD at the receiver chip, and plurality of pull-up transistive elements and plurality of pull-down transistive elements add up to a total impedance (resistance) of 50 Ohms also, then when the voltage control circuit pulls down with all the plurality of pull-up transistive elements and plurality of pull-down transistive elements the voltage control circuit will have brought the voltage down to VDD/2—a voltage divider basically. So, in certain embodiments of the present invention, in order to achieve a bigger voltage swing on the output signal 160, the voltage control circuit is two to three times lower impedance than the receiver termination. For a 50 Ohm termination, in a certain embodiment of the present invention, the voltage control circuit may be 20 Ohms to effectively pull the output signal 160 substantially close to ground 115.

Figure 7:
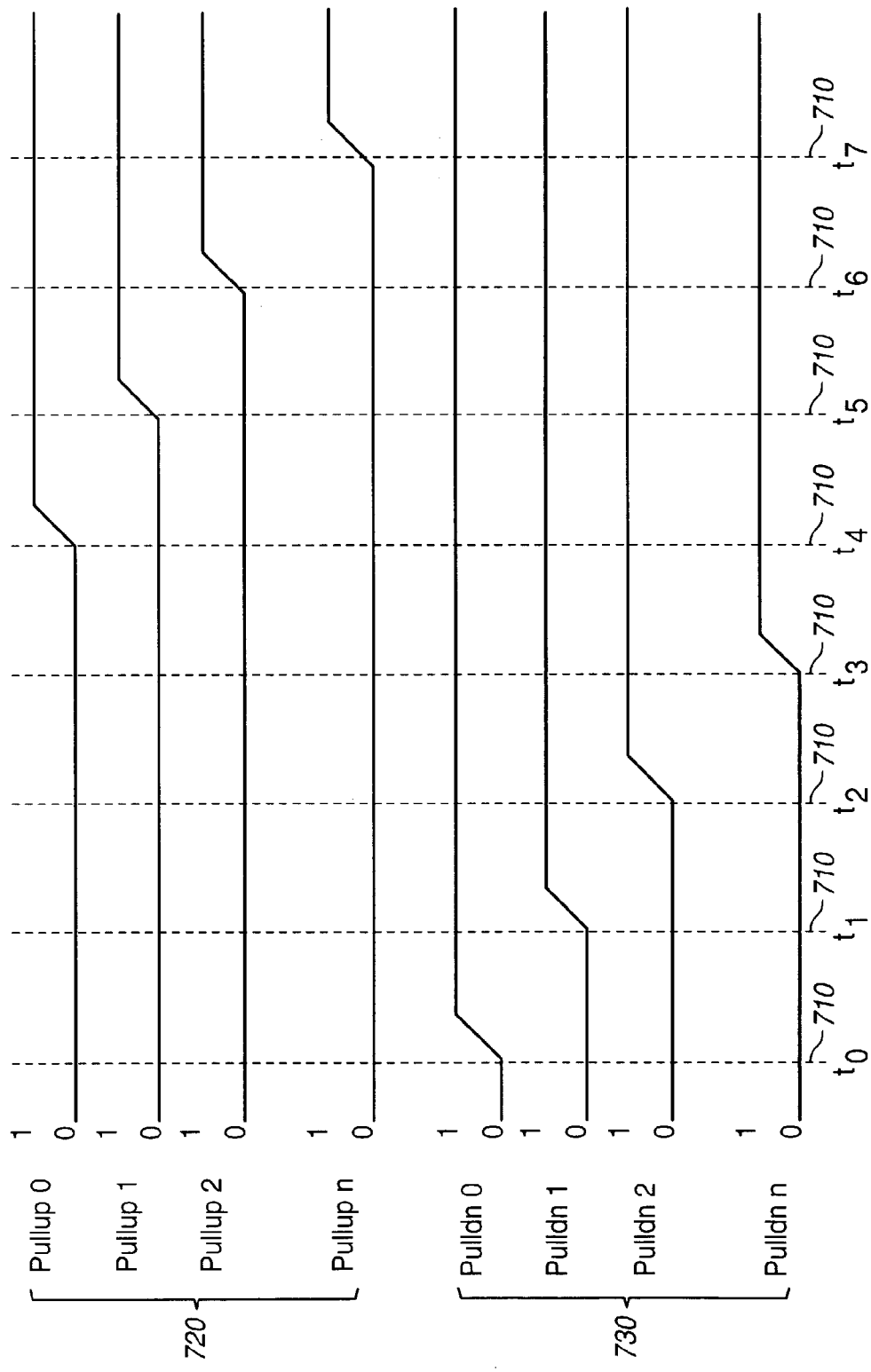
FIG. 7 is a first timing diagram of a voltage control circuit comprising pull-up and pull-down transistive elements, in accordance with certain embodiments of the present invention.
Figure 8:
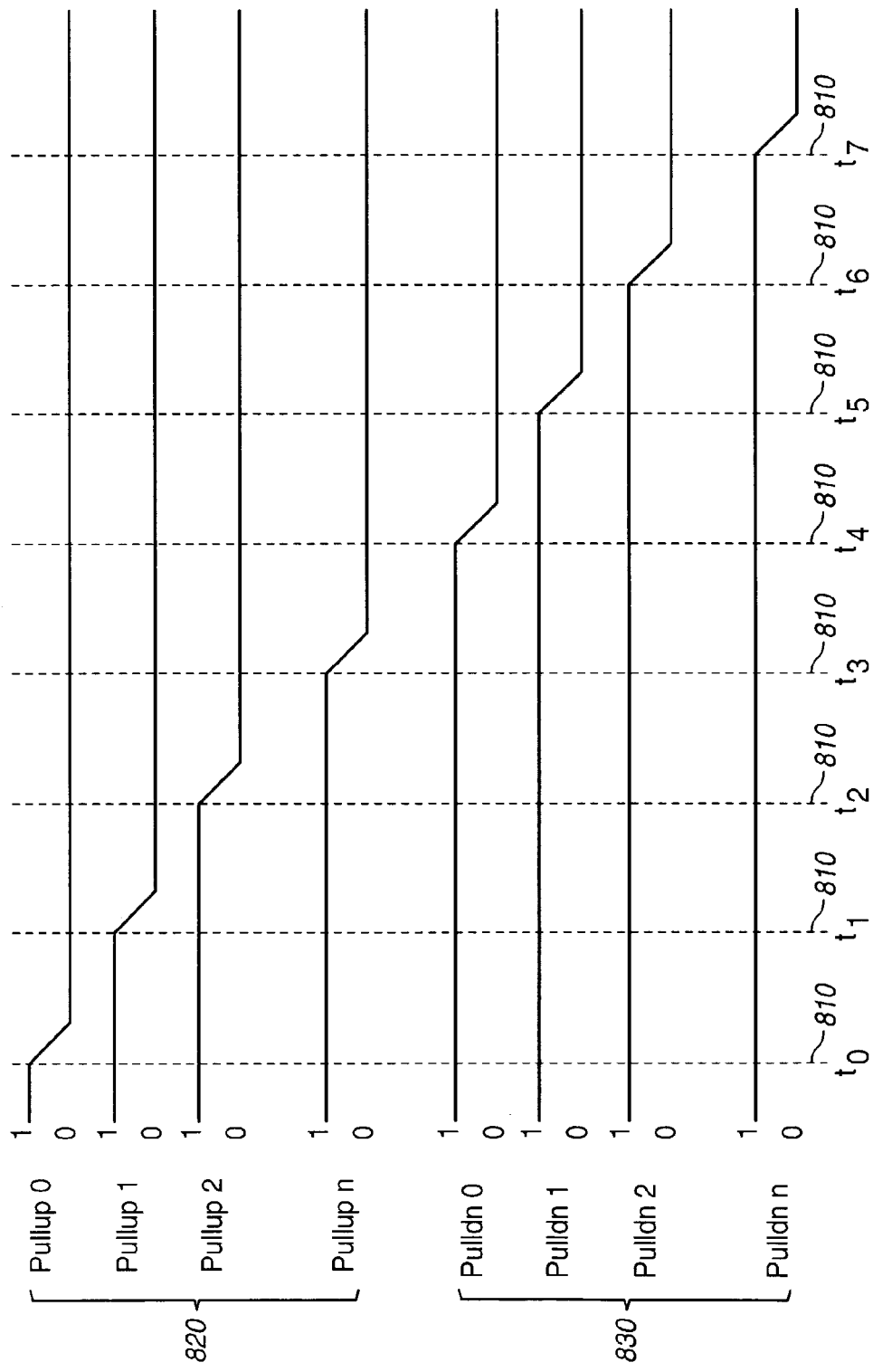
FIG. 8 is a second timing diagram of a voltage control circuit comprising pull-up and pull-down transistive elements, in accordance with certain embodiments of the present invention.
Figure 9:
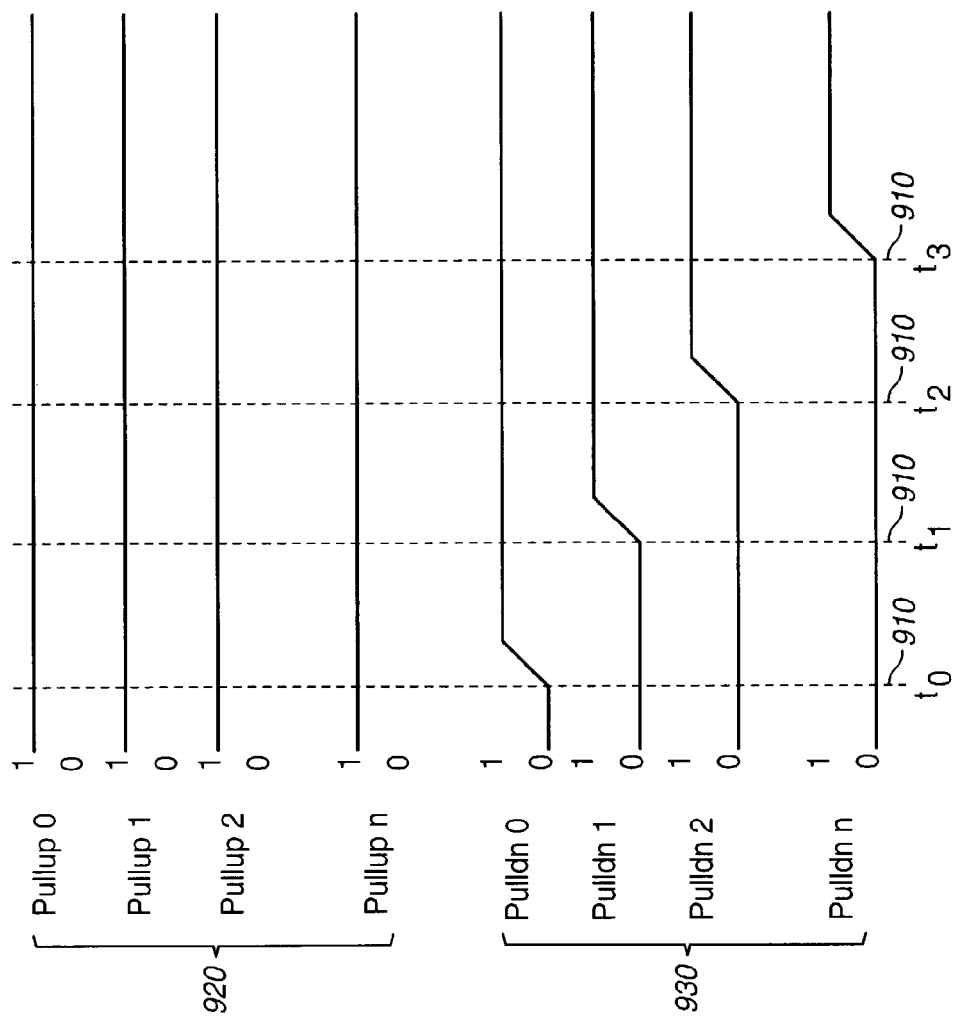
FIG. 9 is a third timing diagram of a voltage control circuit comprising pull-up and pull-down transistive elements, in accordance with certain embodiments of the present invention.
Figure 10:
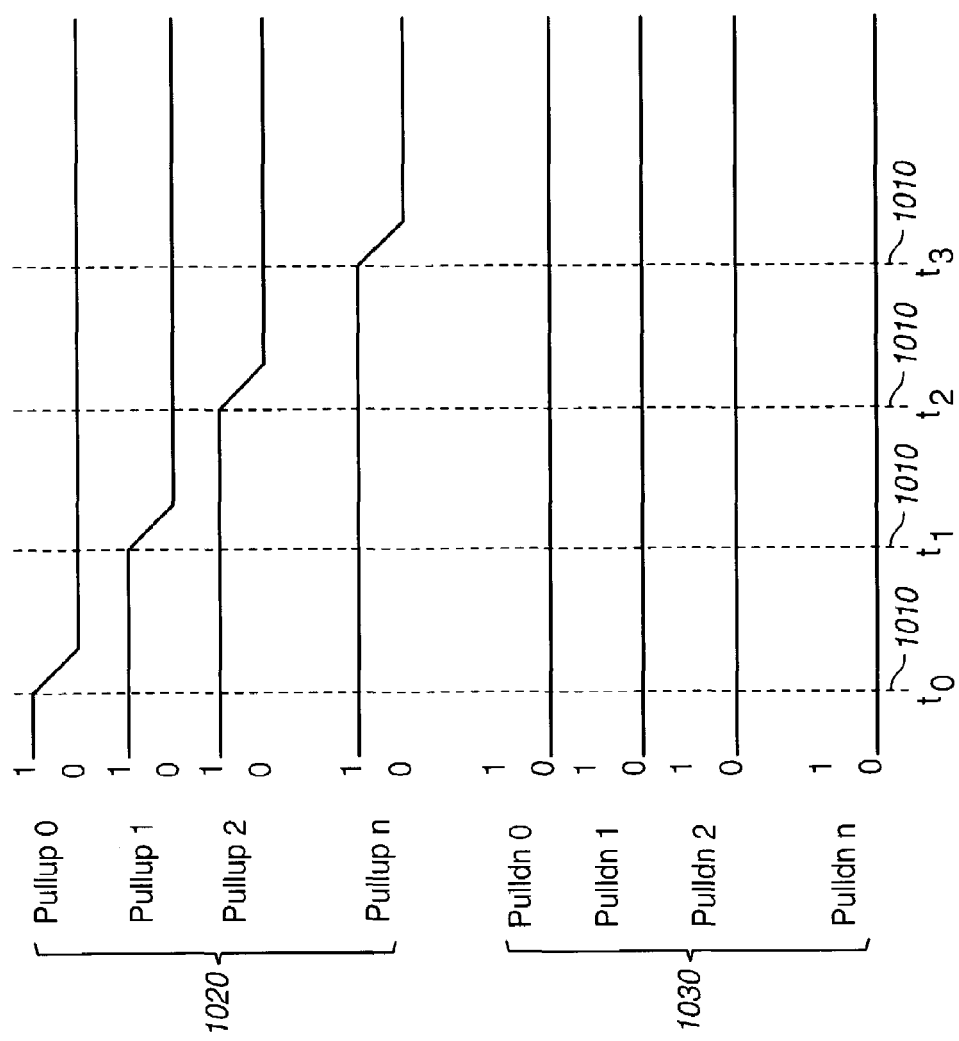
FIG. 10 is a fourth timing diagram of a voltage control circuit comprising pull-up and pull-down transistive elements, in accordance with certain embodiments of the present invention.

Referring now to FIG. 7 a first timing diagram 700 of a voltage control circuit comprising pull-up and pull-down transistive elements is shown, in accordance with certain embodiments of the present invention. Plurality of pull-up transistive elements 720 and plurality of pull-down transistive elements 730 become high at a plurality of time instants 710. Referring now to FIG. 8 a second timing diagram 800 of a voltage control circuit comprising pull-up and pull-down transistive elements is shown, in accordance with certain embodiments of the present invention. Plurality of pull-up transistive elements 820 and plurality of pull-down transistive elements 830 become high at a plurality of time instants 810. Referring now to FIG. 9 a third timing diagram 900 of a voltage control circuit comprising pull-up and pull-down transistive elements is shown, in accordance with certain embodiments of the present invention. Plurality of pull-up transistive elements 920 and plurality of pull-down transistive elements 930 become high at a plurality of time instants 910. Referring now to FIG. 10 a fourth timing diagram 1000 of a voltage control circuit comprising pull-up and pull-down transistive elements is shown, in accordance with certain embodiments of the present invention. Plurality of pull-up transistive elements 1020 and plurality of pull-down transistive elements 1030 become high at a plurality of time instants 1010.

The timing diagrams of FIG. 7, FIG. 8, FIG. 9, and FIG. 10 illustrate how one or more pull-up and one or more pull-down transistive elements are operable to be switched into output signal 160 to enable a precise control of the rise time of output signal 160. It is noted that although several timing scenarios have been illustrated in FIG. 7, FIG. 8, FIG. 9, and FIG. 10 other timing scenarios could be used without departing from the spirit and scope of the present invention. As an example, the plurality of pull-up transistive elements and plurality of pull-down transistive elements may have different corresponding rise times and a corresponding plurality of start times of the different corresponding rise times may be unequally spaced.

Figure 11:
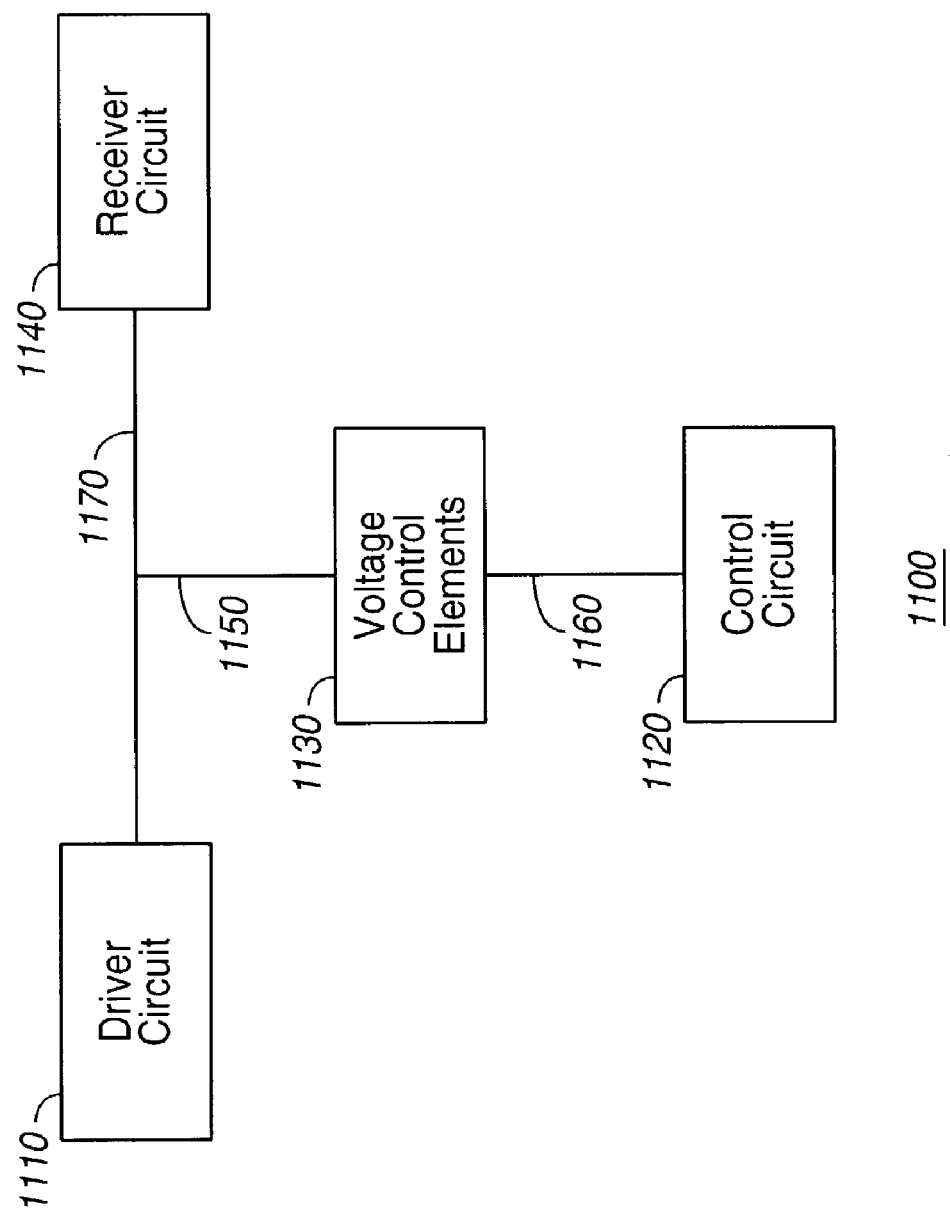
FIG. 11 is a generic block diagram of a circuit for dynamic control of an output driver voltage, in accordance with certain embodiments of the present invention.

Referring now to FIG. 11, a generic block diagram 1100 of a circuit for dynamic control of an output driver voltage is shown, in accordance with certain embodiments of the present invention. A bus 1170 carrying a bus signal is coupled to a driver circuit 1110 and coupled to a receiver circuit 1140. Voltage control elements 1130 are coupled to bus 1170, and voltage control elements 1130 are operable to control a rise time of the bus signal. Control circuit 1120 is coupled to voltage control elements 1130, and in certain embodiments of the present invention control circuit 1120 is further coupled to driver circuit 1110. Control circuit 1120 is operable to determine which elements of voltage control elements 1130 are switched into bus 1170. It is noted that first coupling 1150 between bus 1170 and voltage control elements 1130 and second coupling 1160 between control circuit 1120 and voltage control elements 1130 actually represent several connections since voltage control elements 1130 is operable to have multiple points of attachment with bus 1170 and control circuit 1120 is operable to provide voltage control elements 1130 with multiple control signals. It is noted that while voltage control elements 1130 and control circuit 1120 are represented as blocks separate from driver circuit 1110, the functionality contained within blocks 1120 and 1130 may be integrated with the driver functionality of driver circuit 1110, separate from, or some combination as desired without affecting the scope of the invention.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A structure for control of a rise time of a bus signal coupled to a driver circuit, comprising:
   a bus coupled to the driver circuit, said bus carrying the bus signal;
   one or more voltage control elements comprising precharge circuitry and operable to be coupled to the driver circuit and coupled to the bus, said voltage control elements operable to increase or decrease a voltage of the bus signal, relative to a ground at one or more time instants, as determined by the values of one or more capacitive elements coupled to corresponding ones of the one or more voltage control elements; and
   a control circuit coupled to the one or more voltage control elements, said control circuit operable to control the switching of the one or more voltage control elements, thereby controlling the voltage level of the bus signal.

2. The structure of claim 1, wherein one or more voltage increases and one or more voltage decreases are chosen so that the rise time is a minimum time without ringing.

3. The structure of claim 1, wherein an amount of voltage increase caused by switching on one or more of the one or more voltage control elements is proportional to a slew rate of the bus.

4. The structure of claim 1, wherein an amount of increases or decreases in the voltage are chosen to reduce the amount of overshoot and undershoot of the bus signal, thereby enabling the driver circuit to operate at higher frequencies.

5. The structure of claim 1, wherein the bus is terminated.

6. The structure of claim 1, wherein the bus is a chip-to-chip bus.

7. The structure of claim 1, wherein the bus is on a PCB.

8. The structure of claim 1, wherein the bus is on a multiple chip module.

9. The structure of claim 1, wherein the bus is coupled to discrete circuitry.

10. The structure of claim 1, wherein the one or more voltage control elements comprise one or more of
    one or more resistive elements;
    one or more capacitive elements;
    one or more transistive elements; and
    one or more voltage dividers.

11. The structure of claim 10, wherein the one or more capacitive elements are capacitors.

12. The structure of claim 10, wherein the one or more transistive elements are transistors.

13. The structure of claim 10, wherein the one or more transistive elements are one or more pull-down field effect transistors and one or more pull-up field effect transistors.

14. The structure of claim 13, wherein one or more pull-down transistive elements are used to reduce the effect of the one or more pull-up transistive elements.

15. The structure of claim 13, wherein the one or more pull-down elements occur after one or more of the one or more pull-up elements.

16. The structure of claim 1, wherein an amount of voltage increase and an amount of voltage decrease has a pyramid formation over the one or more time instants.

17. The structure of claim 1, wherein the voltage increases over time are front-loaded so that larger voltage increases occur before smaller voltage increases.

18. The structure of claim 1, wherein the voltage is increased or decreased by one or more constant amounts during each time instant of the corresponding one or more time instants.

19. A structure for control of a rise time of a bus signal coupled to a driver circuit, comprising:
    a bus coupled to the driver circuit, said bus carrying the bus signal;
    one or more voltage control elements operable to be coupled to the driver circuit and coupled to the bus, said voltage control elements operable to increase or decrease a voltaae of the bus signal, relative to a ground at one or more time instants, as determined by the values of one or more capacitive elements coupled to corresponding ones of the one or more voltage control elements; and a control circuit coupled to the one or more voltage control elements, said control circuit operable to control the switching of the one or more voltage control elements, thereby controlling the voltage level of the bus signal, wherein an amount of voltage increase and an amount of voltage decrease has a pyramid formation over the one or more time instants.

20. A structure for control of a rise time of a bus signal coupled to a driver circuit, comprising:

a bus coupled to the driver circuit, said bus carrying the bus signal;

one or more voltage control elements operable to be coupled to the driver circuit and coupled to the bus, said voltage control elements operable to increase or decrease a voltage of the bus signal, relative to a ground at one or more time instants, as determined by the values of one or more capacitive elements coupled to corresponding ones of the one or more voltage control elements; and a control circuit coupled to the one or more voltage control elements, said control circuit operable to control the switching of the one or more voltage control elements, thereby controlling the voltage level of the bus signal wherein the voltage increases over time are front-loaded so that larger voltage increases occur before smaller voltage increases.

21. A structure for control of a rise time of a bus signal coupled to a driver circuit, comprising:

a bus coupled to the driver circuit, said bus carrying the bus signal;

one or more voltage control elements operable to be coupled to the driver circuit and coupled to the bus, said voltage control elements operable to increase or decrease a voltage of the bus signal, relative to a ground at one or more time instants, as determined by the values of one or more capacitive elements coupled to corresponding ones of the one or more voltage control elements; and a control circuit coupled to the one or more voltage control elements, said control circuit operable to control the switching of the one or more voltage control elements, thereby controlling the voltage level of the bus signal, wherein the one or more transistive elements are one or more pull-down field effect transistors and one or more pull-up field effect transistors and wherein the one or more pull-down elements occur after one or more of the one or more pull-up elements.

22. A structure for control of a rise time of a bus signal coupled to a driver circuit, comprising:

a bus coupled to the driver circuit, said bus carrying the bus signal;

one or more voltage control elements operable to be coupled to the driver circuit and coupled to the bus, said voltage control elements operable to increase or decrease a voltage of the bus signal, relative to a ground at one or more time instants, as determined by the values of one or more capacitive elements coupled to corresponding ones of the one or more voltage control elements; and a control circuit coupled to the one or more voltage control elements, said control circuit operable to control the switching of the one or more voltage control elements, thereby controlling the voltage level of the bus signal, wherein the voltage is increased or decreased by one or more constant amounts during each time instant of the corresponding one or more time instants.

23. The structure of claim 22, wherein the one or more constant amounts are equal.

24. The structure of claim 22, wherein the one or more constant amounts are equal.

25. A method for controlling a rise time of a bus signal of a driver circuit, comprising: adaptively adjusting a voltage level of the bus signal relative to a ground at one or more discrete times by the use of one or more voltage control elements and one or more corresponding capacitive elements, wherein the one or more voltage control elements comprise pre-charge circuitry.

26. The method of claim 25, wherein the voltage level is adjusted so that the rise time is a minimum time without ringing.

27. The method of claim 25, wherein a change in the voltage level is proportional to a slew rate of the bus.

28. The method of claim 25, wherein an amount of increase or decrease in the voltage is chosen to reduce the amount of overshoot and undershoot of the bus signal, thereby enabling the driver circuit to operate at higher frequencies.

29. The method of claim 25, wherein an amount of voltage increase and an amount of voltage decrease has a pyramid formation over the one or more time instants.

30. The method of claim 25, wherein one or more voltage adjustments over time are front-loaded so that larger voltage increases occur before smaller voltage increases.

31. The method of claim 25, wherein the voltage is increased or decreased by one or more constant amounts during each time instant of the corresponding one or more time instants.

32. A method for controlling a rise time of a bus signal of a driver circuit, comprising: adaptively adjusting a voltage level of the bus signal relative to a ground at one or more discrete times by the use of one or more voltage control elements and one or more corresponding capacitive elements, wherein an amount of voltage increase and an amount of voltage decrease has a pyramid formation over the one or more time instants.

33. A method for controlling a rise time of a bus signal of a driver circuit, comprising: adaptively adjusting a voltage level of the bus signal relative to a ground at one or more discrete times by the use of one or more voltage control elements and one or more corresponding capacitive elements, wherein one or more voltage adjustments over time are front-loaded so that larger voltage increases occur before smaller voltage increases.

34. A method for controlling a rise time of a bus signal of a driver circuit, comprising: adaptively adjusting a voltage level of the bus signal relative to a ground at one or more discrete times by the use of one or more voltage control elements and one or more corresponding capacitive elements, wherein the voltage is increased or decreased by one or more constant amounts during each time instant of the corresponding one or more time instants.

35. The method of claim 34, wherein the one or more constant amounts are equal.

36. The method of claim 34, wherein the one or more constant amounts are equal.

37. A method for controlling a rise time of a bus signal of a driver circuit, comprising: adaptively adjusting a voltage level of the bus signal relative to a ground at one or more discrete times by the use of one or more voltage control elements and one or more corresponding capacitive elements, wherein the one or more voltage control elements are one or more pull-down transistive elements and one or more pull-up transistive elements, wherein said one or more pull-down transistive elements are used to reduce an overshoot caused by the one or more pull-up transistive elements.

38. The method of claim 37, wherein the one or more pull-down transistive elements occur after one or more of the one or more pull-up transistive elements.

39. The method of claim 37, wherein the one or more pull-down transistive elements occur after one or more of the one or more pull-up transistive elements.

40. A structure for control of a rise time of a bus signal coupled to a driver circuit, comprising:
　a bus coupled to the driver circuit, said bus carrying the bus signal;
　one or more voltage control elements coupled to the driver circuit and coupled to the bus, said voltage control elements operable to increase or decrease a voltage level of the bus signal relative to a ground at one or more time instants and comprising pre-charge circuitry, as determined by the value of one or more capacitive elements coupled to corresponding ones of the one or more voltage control elements;
　a control circuit operable to control the switching of the one or more voltage control elements; and
　a means for controlling the rise time by adaptively adjusting the voltage level of the bus signal relative to a ground at one or more discrete times by the use of the one or more voltage control elements.

\* \* \* \* \*

UNITED STATES PATENT AND TRADEMARK OFFICE
CERTIFICATE OF CORRECTION

PATENT NO.        : 6,995,583 B2
APPLICATION NO. : 10/448762
DATED             : February 7, 2006
INVENTOR(S)       : Jason Harold Culler It is certified that error appears in the above-identified patent and that said Letters Patent is hereby corrected as shown below:

In column 4, line 27, delete "50°" and insert -- 50% --, therefor.

In column 8, line 63, in Claim 19, delete "voltaae" and insert -- voltage --, therefor.

Signed and Sealed this

Second Day of June, 2009

JOHN DOLL
*Acting Director of the United States Patent and Trademark Office*